(12) United States Patent
Kang

(10) Patent No.: US 11,482,973 B2
(45) Date of Patent: Oct. 25, 2022

(54) RECEIVING CIRCUIT, AND SEMICONDUCTOR APPARATUS AND SEMICONDUCTOR SYSTEM USING THE SAME

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 79 days.

(21) Appl. No.: 16/941,266

(22) Filed: Jul. 28, 2020

(65) Prior Publication Data
US 2021/0250000 A1 Aug. 12, 2021

(30) Foreign Application Priority Data
Feb. 10, 2020 (KR) .................. 10-2020-0015489

(51) Int. Cl.
*H03F 3/19* (2006.01)
*H03G 3/30* (2006.01)

(52) U.S. Cl.
CPC ............. *H03F 3/19* (2013.01); *H03G 3/3036* (2013.01); *H03F 2200/36* (2013.01); *H03F 2200/372* (2013.01); *H03G 2201/103* (2013.01)

(58) Field of Classification Search
CPC .......... H03F 1/34; H03F 3/45; H03F 3/45479; H03F 3/68; H03F 3/19; H03F 2200/36; H03F 2200/372; H03F 1/26; H03F 1/42; H03F 2203/45521; H03F 2203/45652; H03F 3/45197; H03F 3/45659; H03F 3/45183; H03F 3/45179; H03G 3/3036; H03G 2201/103; H03G 1/0029; H03G 1/0088; H03G 5/28; H03K 19/0185
USPC ............................. 330/98, 99, 100, 252–261
See application file for complete search history.

(56) References Cited

U.S. PATENT DOCUMENTS 7,366,427 B2 * 4/2008 Li .......................... H04B 10/40
330/103
9,231,532 B2 1/2016 Tsunoda

* cited by examiner

*Primary Examiner* — Hieu P Nguyen
(74) *Attorney, Agent, or Firm* — William Park & Associates Ltd.

(57) ABSTRACT

A receiving circuit may include a first amplifying circuit, a second amplifying circuit, a third amplifying circuit, and a feedback circuit. The first amplifying circuit amplifies a first input signal and a second input signal to generate a first amplified signal and a second amplified signal, respectively. The second amplifying circuit amplifies the first amplified signal and the second amplified signal to generate a first preliminary output signal and a second preliminary output signal, respectively. The third amplifying circuit amplifies the first preliminary output signal and the second preliminary output signal to generate a first output signal and a second output signal, respectively. The feedback circuit changes voltage levels of the first amplified signal and the second amplified signal based on a current control signal, the first output signal, and the second output signal.

18 Claims, 5 Drawing Sheets

RECEIVING CIRCUIT, AND SEMICONDUCTOR APPARATUS AND SEMICONDUCTOR SYSTEM USING THE SAME

CROSS-REFERENCES TO RELATED APPLICATION

The present application claims priority under 35 U.S.C. § 119(a) to Korean application number 10-2020-0015489, filed on Feb. 10, 2020, in the Korean Intellectual Property Office, which is incorporated herein by reference in its entirety.

BACKGROUND

1. Technical Field

Various embodiments generally relate to an integrated circuit technology, and more particularly, to a receiving circuit that receives a signal transmitted through a signal transmission line, and a semiconductor apparatus and a semiconductor system using the same.

2. Related Art

An electronic device includes many electronic components. A computer system, for example, may include many semiconductor apparatuses composed of semiconductors. The semiconductor apparatuses constituting the computer system may communicate with each other by transmitting and receiving clocks and data. The semiconductor apparatuses may each include a receiving circuit to receive a signal transmitted from an external device or receive a signal transmitted between internal circuits of the semiconductor apparatuses. The receiving circuit may include an amplifying circuit that performs a differential amplifying operation. As an operation speed of the semiconductor apparatus increases gradually, a signal with a high frequency is transmitted through a channel. The receiving circuit may accurately receive the signal only when having a gain and a bandwidth suitable for the frequency of the signal transmitted through the channel. When the signal is transmitted through the channel, there are various factors that cause signal loss. The representative examples thereof include inter-symbol interference (ISI), cross-talk, and the like. In a high-speed operation environment, in order to stably transmit and receive a signal, it is necessary to appropriately adjust the gain and the bandwidth of the receiving circuit such that the inter-symbol interference and the cross-talk are compensated for.

SUMMARY

In an embodiment, a receiving circuit may include a first amplifying circuit, a second amplifying circuit, a third amplifying circuit, and a feedback circuit. The first amplifying circuit may be configured to amplify a first input signal and a second input signal and to generate a first amplified signal and a second amplified signal, respectively. The second amplifying circuit may be configured to amplify the first amplified signal and the second amplified signal and to generate a first preliminary output signal and a second preliminary output signal, respectively. The third amplifying circuit may be configured to amplify the first preliminary output signal and the second preliminary output signal and to generate a first output signal and a second output signal, respectively. The feedback circuit may be configured to change voltage levels of the first amplified signal and the second amplified signal based on a current control signal, the first output signal, and the second output signal.

In an embodiment, a receiving circuit may include a first amplifying circuit, a second amplifying circuit, a third amplifying circuit, and a feedback circuit. The first amplifying circuit may be configured to amplify a first input signal and a second input signal and to generate a first amplified signal and a second amplified signal, respectively. The second amplifying circuit may be configured to amplify the first amplified signal and the second amplified signal and to generate a first preliminary output signal and a second preliminary output signal, respectively. The third amplifying circuit may be configured to amplify the first preliminary output signal and the second preliminary output signal to generate a first output signal and a second output signal, respectively, and configured to increase a total gain of the first and second output signals based on a resistance control signal. The feedback circuit may be configured to change voltage levels of the first amplified signal and the second amplified signal based on the first output signal and the second output signal, and configured to increase bandwidths of the first amplified signal and the second amplified signal based on a current control signal.

DETAILED DESCRIPTION

Figure 1:
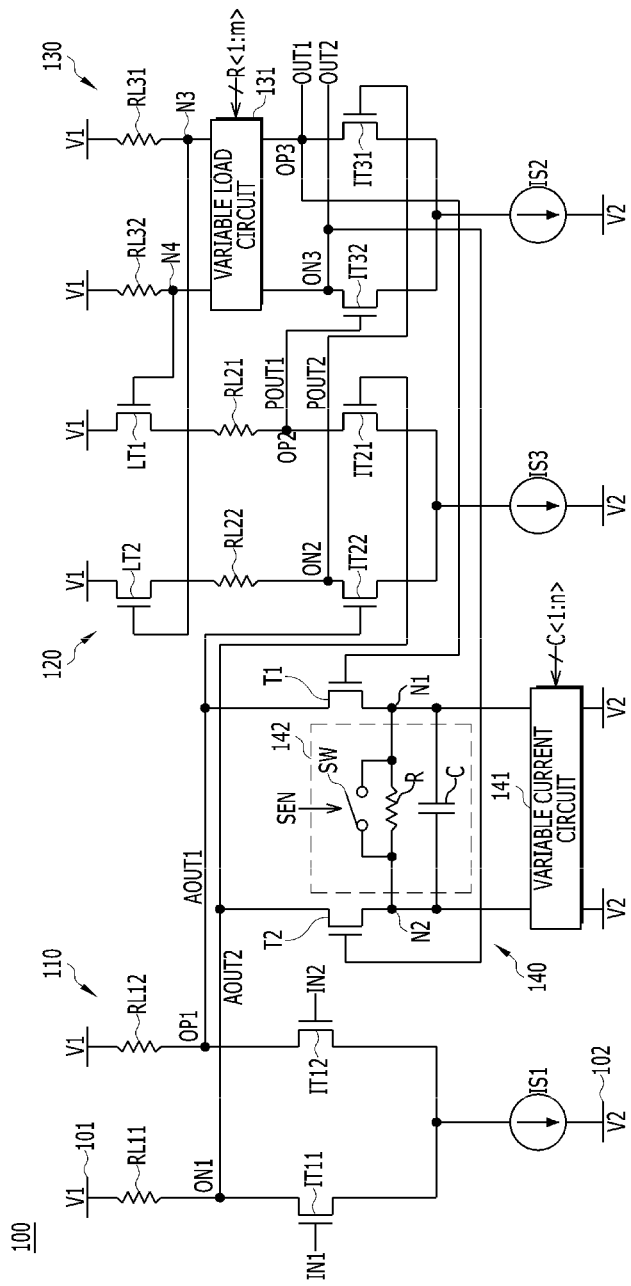
FIG. 1 is a diagram illustrating a configuration of a receiving circuit in accordance with an embodiment.

FIG. 1 is a diagram illustrating a configuration of a receiving circuit 100 in accordance with an embodiment. Referring to FIG. 1, the receiving circuit 100 may generate a first output signal OUT1 and a second output signal OUT2 based on a first input signal IN1 and a second input signal IN2. The second input signal IN2 may be a complementary signal of the first input signal IN1. In an embodiment, the second input signal IN2 may be a reference voltage, and the reference voltage may have a voltage level corresponding to the middle of a range in which the first input signal IN1 swings. The second output signal OUT2 may be a complementary signal of the first output signal OUT1. The receiving circuit 100 may include a plurality of amplifying circuits that receive a first voltage V1 and a second voltage V2 and perform an amplifying operation. The first voltage V1 may have a higher voltage level than the second voltage V2.

The receiving circuit 100 may include a first amplifying circuit 110, a second amplifying circuit 120, a third amplifying circuit 130, and a feedback circuit 140. The first amplifying circuit 110 may receive the first input signal IN1 and the second input signal IN2, and amplify the first input signal IN1 and the second input signal IN2 to generate a first amplified signal AOUT1 and a second amplified signal AOUT2, respectively. The first amplified signal AOUT1 may have a logic level corresponding to the first input signal IN1, and the second amplified signal AOUT2 may have a logic level corresponding to the second input signal IN2. The second amplifying circuit 120 may receive the first amplified signal AOUT1 and the second amplified signal AOUT2, and amplify the first amplified signal AOUT1 and the second amplified signal AOUT2 to generate a first preliminary output signal POUT1 and a second preliminary output signal POUT2, respectively. The first preliminary output signal POUT1 may have a logic level corresponding to the first amplified signal AOUT1, and the second preliminary output signal POUT2 may have a logic level corresponding to the second amplified signal AOUT2. The third amplifying circuit 130 may receive the first preliminary output signal POUT1 and the second preliminary output signal POUT2, and amplify the first preliminary output signal POUT1 and the second preliminary output signal POUT2 to generate the first output signal OUT1 and the second output signal OUT2, respectively. The first output signal OUT1 may have a logic level corresponding to the first preliminary output signal POUT1, and the second output signal OUT2 may have a logic level corresponding to the second preliminary output signal POUT2.

The feedback circuit 140 may receive the first output signal OUT1 and the second output signal OUT2 generated from the third amplifying circuit 130. The feedback circuit 140 may change voltage levels of the first amplified signal AOUT1 and the second amplified signal AOUT2 based on the first output signal OUT1 and the second output signal OUT2. The feedback circuit 140 may receive a current control signal C<1:n> (n is an integer equal to or greater than 2), and adjust the variation widths of the voltage levels of the first and second amplified signals AOUT1 and AOUT2 based on the current control signal C<1:n>. The bandwidths of the first and second amplified signals AOUT1 and AOUT2 may be changed according to the variation widths of the voltage levels. For example, as the variation widths of the voltage levels increase, the bandwidths of the first and second amplified signals AOUT1 and AOUT2 may increase. The bandwidth may refer to a range of a frequency in which the amplifying circuit may obtain an AC gain of a certain size or more. The AC gain may refer to a gain of the amplifying circuit in a relatively high frequency range, and may refer to a gain of an output signal generated by the amplifying circuit when a voltage level of an input signal inputted to the amplifying circuit is transitioned from a logic low level to a logic high level or from a logic high level to a logic low level. A DC gain may refer to a gain of the amplifying circuit in a relatively low frequency range, and may refer to a gain of an output signal generated by the amplifying circuit when an input signal of the amplifying circuit substantially maintains a steady state voltage level. The gain and/or the total gain of the amplifying circuit may be used as a term including both the DC gain and the AC gain. The gain or the bandwidth of the amplifying circuit may be used as substantially the same meaning as the gain or the bandwidth of the output signal generated by the amplifying circuit.

The feedback circuit 140 may further receive a switch control signal (SEN). The feedback circuit 140 may adjust the gain and the bandwidths of the first and second amplified signals AOUT1 and AOUT2 based on the switch control signal (SEN). When increasing the bandwidths of the first and second amplified signals AOUT1 and AOUT2 based on the current control signal C<1:n>, the feedback circuit 140 may increase the DC gains and the bandwidths of the first and second amplified signals AOUT1 and AOUT2 and decrease the AC gains thereof based on the switch control signal (SEN). The third amplifying circuit 130 may receive a resistance control signal R<1:m> (m is an integer equal to or greater than 2), and increase the total gain of the first output signal OUT1 and the second output signal OUT2 based on the resistance control signal R<1:m>. A more detailed description thereof will be given below.

The first amplifying circuit 110 may include a first input transistor IT11 and a second input transistor IT12. The first and second input transistors IT11 and IT12 may be N-channel MOS transistors. The first input transistor IT11 may change the voltage level of the second amplified signal AOUT2 based on the first input signal IN1. The first input transistor IT11 may be connected between a second amplification node ON1 and a second voltage terminal 102 to which the second voltage V2 is supplied, and may receive the first input signal IN1. The second amplification node ON1 may be connected to a first voltage terminal 101 to which the first voltage V1 is supplied, and the second amplified signal AOUT2 may be outputted through the second amplification node ON1. The second input transistor IT12 may change the voltage level of the first amplified signal AOUT1 based on the second input signal IN2. The second input transistor IT12 may be connected between a first amplification node OP1 and the second voltage terminal 102, and may receive the second input signal IN2. The first amplification node OP1 may be connected to the first voltage terminal 101, and the first amplified signal AOUT1 may be outputted through the first amplification node OP1. A first load resistor RL11 may be connected between the second amplification node ON1 and the first voltage terminal 101, and a second load resistor RL12 may be connected between the first amplification node OP1 and the first voltage terminal 101. The first and second load resistors RL11 and RL12 may have substantially the same resistance value. In an embodiment, the first and second load resistors RL1 and RL2 may have different resistance values. The first and second input transistors IT11 and IT12 may be connected to the second voltage terminal 102 through a first current source IS1. The present embodiment describes that in the first amplifying circuit 110, the first and second input transistors IT11 and IT12 are configured as N-channel MOS transistors; however, the present disclosure is not intended to be limited thereto. The first and second input transistors IT11 and IT12 may be configured as P-channel MOS transistors and the first amplifying circuit 110 may also be implemented as a P-type amplifying circuit.

The feedback circuit 140 may include a first transistor T1, a second transistor T2, and a variable current circuit 141. The first and second transistors T1 and T2 may be N-channel MOS transistors. The first transistor T1 may change the voltage level of the first amplified signal AOUT1 based on the first output signal OUT1. The first transistor T1 may be connected between the first amplification node OP1 and a first node N1, and may receive the first output signal OUT1. The second transistor T2 may change the voltage level of the second amplified signal AOUT2 based on the second output signal OUT2. The second transistor T2 may be connected between the second amplification node ON1 and a second node N2, and may receive the second output signal OUT2.

The variable current circuit 141 may connect between the first node N1 and the second voltage terminal 102, and connect between the second node N2 and the second voltage terminal 102. The variable current circuit 141 may discharge the first and second nodes N1 and N2. The variable current circuit 141 may receive the current control signal C<1:n>, and adjust the amount of a current flowing from the first and second nodes N1 and N2 to the second voltage terminal 102 based on the current control signal C<1:n>. The amount of the current flowing through the variable current circuit 141 may correspond to the variation widths of the voltage levels of the first and second amplified signals AOUT1 and AOUT2. As the amount of the current flowing through the variable current circuit 141 increases, the variation widths of the voltage levels of the first and second amplified signals AOUT1 and AOUT2 may be increased. As the amount of the current flowing through the variable current circuit 141 decreases, the variation widths of the voltage levels of the first and second amplified signals AOUT1 and AOUT2 may be decreased.

The feedback circuit 140 may further include a coupling circuit 142. The coupling circuit 142 may receive the switch control signal (SEN). The coupling circuit 142 may connect the first and second nodes N1 and N2 based on the switch control signal (SEN). When the first and second nodes N1 and N2 are connected through the coupling circuit 142, the DC gains and the bandwidths of the first and second amplified signals AOUT1 and AOUT2 may be increased and the AC gains thereof may be decreased. The coupling circuit 142 may include a resistor element R, a capacitor element C, and a switch SW. The resistor element R may be connected between the first and second nodes N1 and N2. The capacitor element C may be connected in parallel with the resistor element R between the first and second nodes N1 and N2. The switch SW may be connected in parallel with the resistor element R and the capacitor element C between the first and second nodes N1 and N2. The switch SW may short-circuit the first and second nodes N1 and N2 based on the switch control signal (SEN). When the switch control signal (SEN) is enabled and the switch SW is turned on, the first and second nodes N1 and N2 may be short-circuited, and the resistor element R and the capacitor element C may not affect a change in the voltage levels of the first and second nodes N1 and N2. When the first and second nodes N1 and N2 are short-circuited, the DC gains and the bandwidths of the first and second amplified signals AOUT1 and AOUT2 may be decreased and the AC gains thereof may be increased. When the switch control signal (SEN) is disabled and the switch SW is turned off, the resistor element R and the capacitor element C may form R-C coupling between the first and second nodes N1 and N2. When the R-C coupling is formed, the DC gains and the bandwidths of the first and second amplified signals AOUT1 and AOUT2 may be increased and the AC gains thereof may be decreased.

The third amplifying circuit 130 may include a first input transistor IT31, a second input transistor IT32, and a variable load circuit 131. The first input transistor IT31 and the second input transistor IT32 may be N-channel MOS transistors. The first input transistor IT31 may change the voltage level of the first output signal OUT1 based on the second preliminary output signal POUT2. The first input transistor IT31 may be connected between a first output node OP3 and the second voltage terminal 102, and may receive the second preliminary output signal POUT2. The first output node OP3 may be connected to the first voltage terminal 101 through the variable load circuit 131, and the first output signal OUT1 may be outputted through the first output node OP3. The second input transistor IT32 may change the voltage level of the second output signal OUT2 based on the first preliminary output signal POUT1. The second input transistor IT32 may be connected between a second output node ON3 and the second voltage terminal 102, and may receive the first preliminary output signal POUT1. The second output node ON3 may be connected to the first voltage terminal 101 through the variable load circuit 131, and the second output signal OUT2 may be outputted through the second output node ON3. The first and second input transistors IT31 and IT32 may be connected to the second voltage terminal 102 through a second current source IS2. The amount of a current flowing through the second current source 152 may be substantially the same as or different from that of the current flowing through the first current source IS1.

The variable load circuit 131 may connect between a third node N3 and the first output node OP3 and between a fourth node N4 and the second output node ON3. The third and fourth nodes N3 and node N4 may be connected to the first voltage terminal 101 and may receive the first voltage V1. The third node N3 may be connected to the first voltage terminal 101 through a first load resistor RL31, and the fourth node N4 may be connected to the first voltage terminal 101 through a second load resistor RL32. The first load resistor RL31 may have substantially the same resistance value as that of the second load resistor RL32. In an embodiment, the first and second load resistors RL31 and RL32 may also have different resistance values. The variable load circuit 131 may receive the resistance control signal R<1:m>, and adjust a resistance value between the third node N3 and the first output node OP3 and a resistance value between the fourth node N4 and the second output node ON3. As the resistance value of the first load resistor RL31 increases based on the resistance control signal R<1:m>, the total gain of the first and second output signals OUT1 and OUT2 may be increased. On the other hand, as the resistance value of the first load resistor RL31 decreases based on the resistance control signal R<1:m>, the total gain of the first and second output signals OUT1 and OUT2 may be decreased.

The second amplifying circuit 120 may include a first input transistor IT21, a second input transistor IT22, a first load transistor LT1, and a second load transistor LT2. The first input transistor IT21, the second input transistor IT22, the first load transistor LT1, and the second load transistor LT2 may be N-channel MOS transistors. The first input transistor IT21 may change the voltage level of a first preliminary output node OP2 based on the second amplified signal AOUT2. The first input transistor IT21 may be connected between the first preliminary output node OP2 and the second voltage terminal 102, and may receive the second amplified signal AOUT2. The first preliminary output node OP2 may be connected to the first load transistor LT1, and the first preliminary output signal POUT1 may be outputted through the first preliminary output node OP2. The second input transistor IT22 may change the voltage level of a second preliminary output node ON2 based on the first amplified signal AOUT1. The second input transistor IT22 may be connected between the second preliminary output node ON2 and the second voltage terminal 102, and may receive the first amplified signal AOUT1. The second preliminary output node ON2 may be connected to the second load transistor LT2, and the second preliminary output signal POUT2 may be outputted through the second preliminary output node ON2. The first and second input transistors IT21 and IT22 may be connected to the second voltage terminal 102 through a third current source IS3. The amount of a current flowing through the third current source IS3 may be substantially the same as that of the current flowing through the first current source IS1 and that of the current flowing through the second current source 152, or may be different from that of the current flowing through the first current source IS1 or the second current source 152.

The first load transistor LT1 may be connected between the first voltage terminal 101 and the first preliminary output node OP2, and a gate of the first load transistor LT1 may be connected to the fourth node N4. The first load transistor LT1 may supply the first voltage V1 to the first preliminary output node OP2 based on the voltage level of the fourth node N4. The second load transistor LT2 may be connected between the first voltage terminal 101 and the second preliminary output node ON2, and a gate of the second load transistor LT2 may be connected to the third node N3. The second load transistor LT2 may supply the first voltage V1 to the second preliminary output node ON2 based on the voltage level of the third node N3. The present embodiment describes that the second amplifying circuit 120 includes the first and second load transistors LT1 and LT2 and is connected to the third amplifying circuit 130 in a negative feedback manner; however, the present disclosure is not intended to be limited thereto. In an embodiment, the second amplifying circuit 120 may not include the first and second load transistors LT1 and LT2. A first load resistor RL21 may be connected between the first load transistor LT1 and the first preliminary output node OP2. A second load resistor RL22 may be connected between the second load transistor LT2 and the second preliminary output node ON2. The first and second load resistors RL21 and RL22 may have substantially the same resistance value. In an embodiment, the first and second load resistors RL21 and RL22 may have different resistance values.

Figure 2:
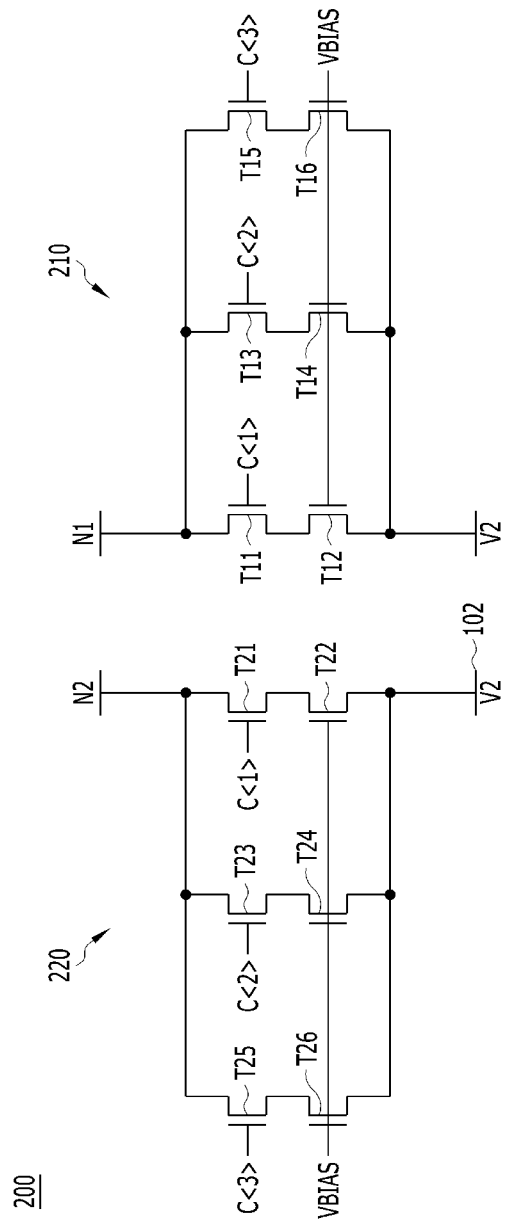
FIG. 2 is a diagram illustrating a configuration of a variable current circuit in accordance with an embodiment.

FIG. 2 is a diagram illustrating a configuration of a variable current circuit 200 in accordance with an embodiment. The variable current circuit 200 may be applied as the variable current circuit 141 illustrated in FIG. 1. Referring to FIG. 1 and FIG. 2, the variable current circuit 200 may connect between the first node N1 and the second voltage terminal 102 and between the second node N2 and the second voltage terminal 102. The variable current circuit 200 may include a first variable current circuit 210 and a second variable current circuit 220. The first variable current circuit 210 may be connected between the first node N1 and the second voltage terminal 102, and may adjust the amount of the current flowing from the first node N1 to the second voltage terminal 102. The first variable current circuit 210 may include a first transistor T11, a second transistor T12, a third transistor T13, a fourth transistor T14, a fifth transistor T15, and a sixth transistor T16. The first to sixth transistors T11 to T16 may be N-channel MOS transistors. The first and second transistors T11 and T12 may be connected in series between the first node N1 and the second voltage terminal 102. The third and fourth transistors T13 and T14 may be connected in series between the first node N1 and the second voltage terminal 102, and may be connected in parallel with the first and second transistors T11 and T12. The fifth and sixth transistors T15 and T16 may be connected in series between the first node N1 and the second voltage terminal 102, and may be connected in parallel with the first and second transistors T11 and T12. A drain of the first transistor T11 may be connected to the first node N1 and a gate of the first transistor T11 may receive the first bit C<1> of the current control signal. A drain of the second transistor T12 may be connected to a source of the first transistor T11, a source of the second transistor T12 may be connected to the second voltage terminal 102, and a gate of the second transistor T12 may receive a bias voltage VBIAS. The bias voltage VBIAS may have an arbitrary voltage level in order to adjust the amount of a current flowing through the variable current circuit 200. A drain of the third transistor T13 may be connected to the first node N1, and a gate of the third transistor T13 may receive the second bit C<2> of the current control signal. A drain of the fourth transistor T14 may be connected to a source of the third transistor T13, a source of the fourth transistor T14 may be connected to the second voltage terminal 102, and a gate of the fourth transistor T14 may receive the bias voltage VBIAS. A drain of the fifth transistor 115 may be connected to the first node N1, and a gate of the fifth transistor T15 may receive the third bit C<3> of the current control signal. A drain of the sixth transistor T16 may be connected to a source of the fifth transistor T15, a source of the sixth transistor T16 may be connected to the second voltage terminal 102, and a gate of the sixth transistor T16 may receive the bias voltage VBIAS. The second transistor T12, the fourth transistor T14, and the sixth transistor T16 may allow a constant amount of current to flow from the first node N1 to the second voltage terminal 102 based on the bias voltage VBIAS. The first transistor T11, the third transistor T13, and the fifth transistor T15 may be selectively turned on based on the respective bits C<1:3> of the current control signal, resulting in a change in the amount of the current flowing from the first node N1 to the second voltage terminal 102.

The second variable current circuit 220 may be connected between the second node N2 and the second voltage terminal 102, and may adjust the amount of the current flowing from the second node N2 to the second voltage terminal 102. The second variable current circuit 220 may include a first transistor T21, a second transistor T22, a third transistor T23, a fourth transistor T24, a fifth transistor T25, and a sixth transistor T26. The first to sixth transistors T21 to T26 may be N-channel MOS transistors. The first and second transistors T21 and T22 may be connected in series between the second node N2 and the second voltage terminal 102. The third and fourth transistors T23 and T24 may be connected in series between the second node N2 and the second voltage terminal 102, and may be connected in parallel with the first and second transistors T21 and T22. The fifth and sixth transistors T25 and T26 may be connected in series between the second node N2 and the second voltage terminal 102, and may be connected in parallel with the first and second transistors T21 and T22. A drain of the first transistor T21 may be connected to the second node N2, and a gate of the first transistor T21 may receive the first bit C<1> of the current control signal. A drain of the second transistor T22 may be connected to a source of the first transistor T21, a source of the second transistor T22 may be connected to the second voltage terminal 102, and a gate of the second transistor T22 may receive the bias voltage VBIAS. A drain of the third transistor T23 may be connected to the second node N2, and a gate of the third transistor T23 may receive the second bit C<2> of the current control signal. A drain of the fourth transistor T24 may be connected to a source of the third transistor T23, a source of the fourth transistor T24 may be connected to the second voltage terminal 102, and a gate of the fourth transistor T24 may receive the bias voltage VBIAS. A drain of the fifth transistor T25 may be connected to the second node N2 and a gate of the fifth transistor T25 may receive the third bit C<3> of the current control signal. A drain of the sixth transistor T26 may be connected to a source of the fifth transistor T25, a source of the sixth transistor T26 may be connected to the second voltage terminal 102, and a gate of the sixth transistor T26 may receive the bias voltage VBIAS. The second transistor T22, the fourth transistor T24, and the sixth transistor T26 may allow a constant amount of current to flow from the second node N2 to the second voltage terminal 102 based on the bias voltage VBIAS. The first transistor T21, the third transistor T23, and the fifth transistor T25 may be selectively turned on based on the respective bits C<1:3> of the current control signal, resulting in a change in the amount of the current flowing from the second node N2 to the second voltage terminal 102.

Although FIG. 2 illustrates that the current control signal C<1:3> includes three bits, the current control signal C<1:3> may include a fewer or larger number of bits than three bits. The number of transistors constituting the first and second variable current circuits 210 and 220 may be changed according to the number of bits of the current control signal C<1:3>. The first transistors T11 and T21, the third transistors T13 and T23, and the fifth transistors T15 and T25 may have substantially the same size. The size may refer to the ratio of a width and a length of the transistor. In an embodiment, the first transistors T11 and T21, the third transistors T13 and T23, and the fifth transistors T15 and T25 may have different sizes. For example, the size of each of the third transistors T13 and T23 may be twice the size of each of the first transistors T11 and T21, and the size of each of the fifth transistors T15 and T25 may be twice the size of each of the third transistors T13 and T23. The first and second variable current circuits 210 and 220 may include transistors having various sizes to variously change the amounts of the currents flowing from the first and second nodes N1 and N2 to the second voltage terminal 102.

Figure 3:
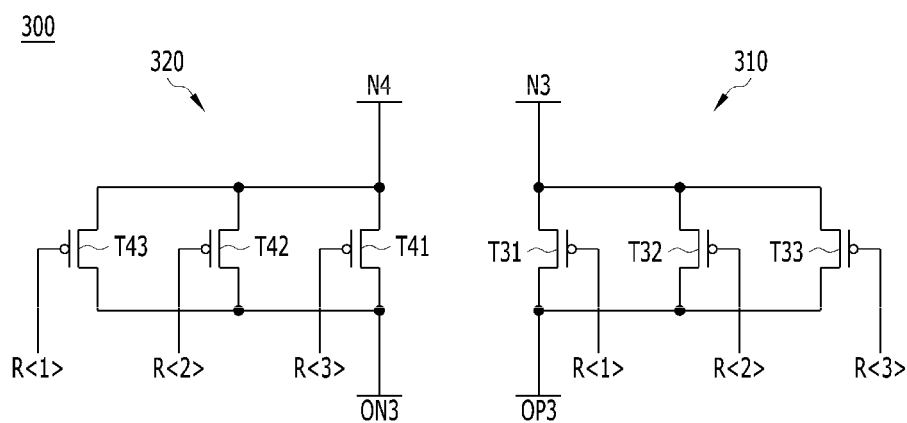
FIG. 3 is a diagram illustrating a configuration of a variable load circuit in accordance with an embodiment.

FIG. 3 is a diagram illustrating a configuration of a variable load circuit 300 in accordance with an embodiment. The variable load circuit 300 may be applied as the variable load circuit 131 illustrated in FIG. 1. Referring to FIG. 1 and FIG. 3, the variable load circuit 300 may connect between the third node N3 and the first output node OP3 and between the fourth node N4 and the second output node ON3. The variable load circuit 300 may include a first variable load circuit 310 and a second variable load circuit 320. The first variable load circuit 310 may variously adjust a resistance value between the third node N3 and the first output node OP3 based on the resistance control signal R<1:3>. The first variable load circuit 310 may include a first transistor T31, a second transistor T32, and a third transistor T33. The first to third transistors T31 to T33 may be P-channel MOS transistors. The first to third transistors T31 to T33 may be connected in parallel between the third node N3 and the first output node OP3. A source of the first transistor T31 may be connected to the third node N3, a drain of the first transistor T31 may be connected to the first output node OP3, and a gate of the first transistor T31 may receive the first bit R<1> of the resistance control signal. A source of the second transistor T32 may be connected to the third node N3, a drain of the second transistor T32 may be connected to the first output node OP3, and a gate of the second transistor T32 may receive the second bit R<2> of the resistance control signal. A source of the third transistor T33 may be connected to the third node N3, a drain of the third transistor T33 may be connected to the first output node OP3, and a gate of the third transistor T33 may receive the third bit R<3> of the resistance control signal.

The second variable load circuit 320 may variously change a resistance value between the fourth node N4 and the second output node ON3 based on the resistance control signal R<1:3>. The second variable load circuit 320 may include a first transistor T41, a second transistor T42, and a third transistor T43. The first to third transistors T41 to T43 may be P-channel MOS transistors. The first to third transistors T41 to T43 may be connected in parallel between the fourth node N4 and the second output node ON3. A source of the first transistor T41 may be connected to the fourth node N4, a drain of the first transistor T41 may be connected to the second output node ON3, and a gate of the first transistor T41 may receive the first bit R<1> of the resistance control signal. A source of the second transistor T42 may be connected to the fourth node N4, a drain of the second transistor T42 may be connected to the second output node ON3, and a gate of the second transistor T42 may receive the second bit R<2> of the resistance control signal. A source of the third transistor T43 may be connected to the fourth node N4, a drain of the third transistor T43 may be connected to the second output node ON3, and a gate of the third transistor T43 may receive the third bit R<3> of the resistance control signal.

Although FIG. 3 illustrates that the resistance control signal R<1:3> includes three bits, the resistance control signal R<1:3> may include a fewer or larger number of bits than three bits. The number of transistors constituting the first and second variable load circuits 310 and 320 may be changed according to the number of bits of the resistance control signal R<1:3>. The first to third transistors T31, T41, T32, T42, T33, and T43 may have substantially the same size. In an embodiment, the first to third transistors T31, T41, T32, T42, T33, and T43 may have different sizes. For example, the size of the second transistors T32 and T42 may be twice the size of the first transistors T31 and T41, and the size of the third transistors T33 and T43 may be twice the size of the second transistors T32 and T42. The first and second variable load circuits 310 and 320 may include transistors having various sizes to set various resistance values based on the resistance control signal R<1:3>.

Figure 4:
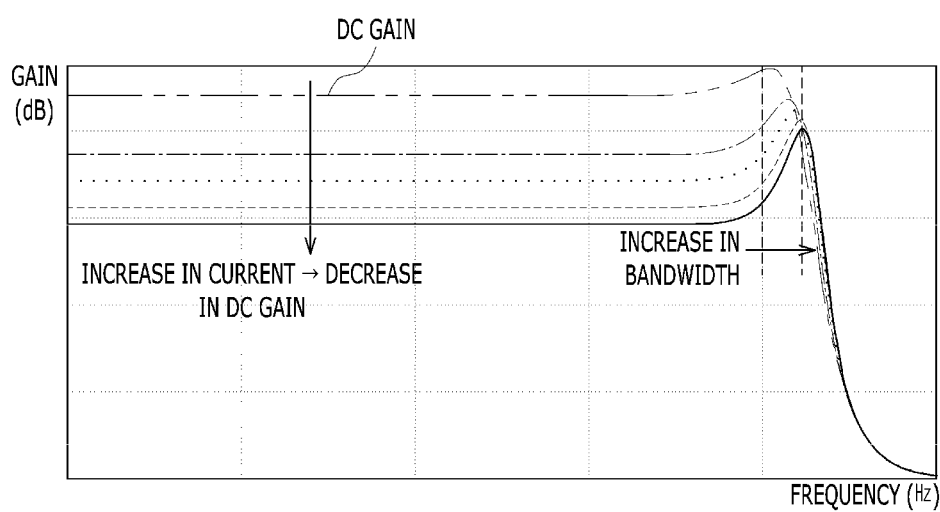
FIG. 4 is a graph illustrating gains of a first amplified signal and a second amplified signal according to operations of the variable current circuits illustrated in FIG. 1 and FIG. 2.

FIG. 4 is a graph illustrating the gain of the first amplified signal AOUT1 and the second amplified signal AOUT2 according to the operations of the variable current circuits 141 and 200 circuit illustrated in FIG. 1 and FIG. 2, In the graph, the horizontal axis denotes frequency in hertz (Hz) and the vertical axis denotes the amount of gain in decibels (dB). Referring to FIG. 1 and FIG. 4, the feedback circuit 140 may receive the first and second output signals OUT1 and OUT2 and increase the bandwidths of the first and second amplified signals AOUT1 and AOUT2, The feedback circuit 140 may change the amount of the current flowing through the variable current circuit 141 according to the current control signal C<1:n>, thereby adjusting the bandwidths of the first and second amplified signals AOUT1 and AOUT2. As the amount of the current flowing through the variable current circuit 141 increases, the variation widths of the voltage levels of the first amplified signal AOUT1 and the second amplified signal AOUT2 may be increased. As the amount of the current flowing through the variable current circuit 141 increases, the DC gain of the first and second amplified signals AOUT1 and AOUT2 may be decreased, so that the bandwidths of the first and second amplified signals AOUT1 and AOUT2 may be increased.

Figure 5:
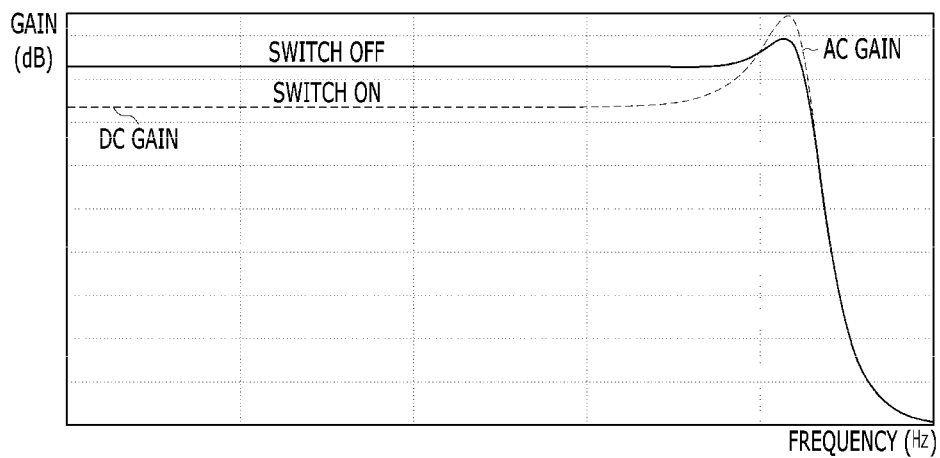
FIG. 5 is a graph illustrating gains of a first amplified signal and a second amplified signal according to whether a coupling circuit illustrated in FIG. 1 is connected.

FIG. 5 is a graph illustrating the gain of the first amplified signal AOUT1 and the second amplified signal AOUT2 according to whether the coupling circuit 142 illustrated in FIG. 1 is connected. In the graph, the horizontal axis denotes frequency in hertz (Hz) and the vertical axis denotes the amount of gain in decibels (dB). Referring to FIG. 1 and FIG. 5, when the switch SW is turned on by the switch control signal (SEN) and the coupling circuit 142 is not connected between the first and second nodes N1 and N2, the DC gains of the first and second amplified signals AOUT1 and AOUT2 may be relatively decreased and the AC gains thereof may be relatively increased. Accordingly, the AC peaking of the first and second amplified signals AOUT1 and AOUT2 may be relatively increased. When the AC peaking increases, the peaking of the first and second amplified signals AOUT1 and AOUT2 may be increased to enable accurate sampling of the first and second amplified signals AOUT1 and AOUT2 in a high frequency operation environment. When the switch SW is turned off and the coupling circuit 142 is connected between the first and second nodes N1 and N2, the DC gains of the first and second amplified signals AOUT1 and AOUT2 may be relatively increased and the AC gains thereof may be relatively decreased. Accordingly, the AC peaking of the first and second amplified signals AOUT1 and AOUT2 may be relatively decreased. Furthermore, the coupling circuit 142 may increase the bandwidths of the first and second amplified signals AOUT1 and AOUT2. When the AC peaking decreases, a difference between the DC gain and the AC gain may be decreased, and the variation widths of the voltage levels of the first and second amplified signals AOUT1 and AOUT2 may be decreased. When the difference between the DC gain and the AC gain is decreased, a voltage margin for distinguishing the first and second amplified signals AOUT1 and AOUT2 may be increased to enable accurate sampling of the first and second amplified signals AOUT1 and AOUT2 in a low frequency operation environment. Accordingly, when the first and second input signals IN1 and IN2 each have a relatively high frequency, the receiving circuit 100 may increase the AC peaking of the first and second amplified signals AOUT1 and AOUT2 by turning on the switch SW of the coupling circuit 142. When the first and second input signals IN1 and IN2 each have a relatively low frequency, the receiving circuit 100 may substantially prevent a decrease in the DC gains of the first and second amplified signals AOUT1 and AOUT2 and increase the bandwidths thereof by turning off the switch SW of the coupling circuit 142.

Figure 6:
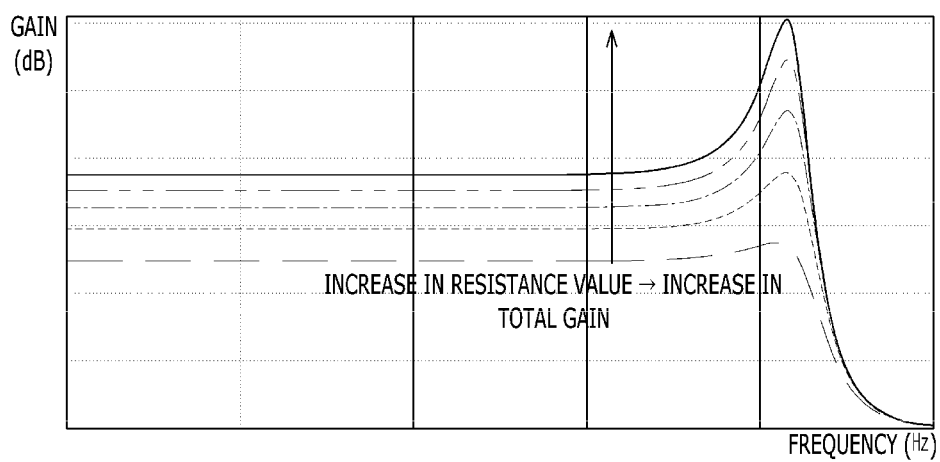
FIG. 6 is a graph illustrating gains of a first output signal and a second output signal according to operations of the variable load circuits illustrated in FIG. 1 and FIG. 3.

FIG. 6 is a graph illustrating the gain of the first output signal OUT1 and the second output signal OUT2 according to the operations of the variable load circuits 131 and 300 illustrated in FIG. 1 and FIG. 3. In the graph, the horizontal axis denotes frequency in hertz (Hz) and the vertical axis denotes the amount of a gain in decibels (dB), Referring to FIG. 1 and FIG. 6, as the resistance value of the variable load circuit 131 increases according to the resistance control signal R<1:m>, the total gain of the first and second output signals OUT1 and OUT2 may be increased. When the total gain of the first and second output signals OUT1 and OUT2 increases, the first and second output signals OUT1 and OUT2 having more accurate voltage levels may be generated from the third amplifying circuit 130. In general, when the total gain increases, the bandwidth may be decreased. In such a case, the feedback circuit 140 may receive the first and second output signals OUT1 and OUT2 and increase the bandwidths of the first and second amplified signals AOUT1 and AOUT2. Accordingly, the feedback circuit 140 may compensate for a decrease in the bandwidth in the third amplifying circuit 130, thereby increasing a gain while substantially maintaining the bandwidth of the entire receiving circuit 100.

Figure 7:
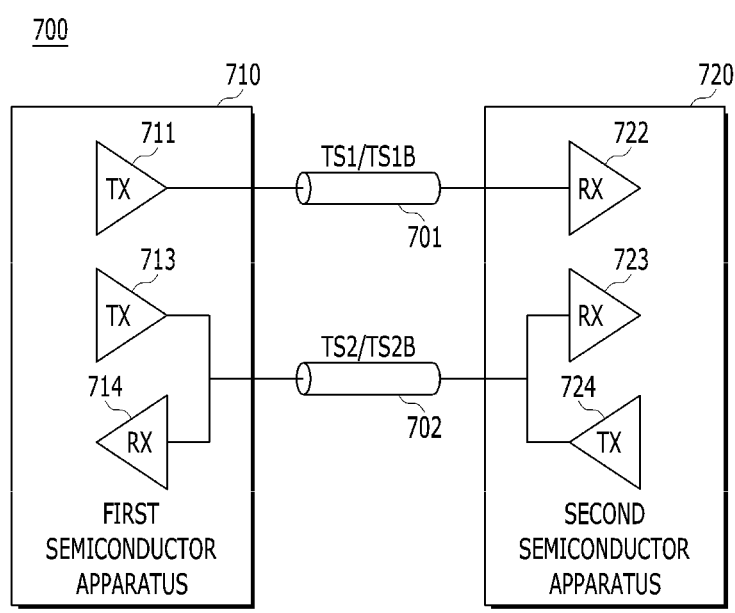
FIG. 7 is a diagram illustrating a configuration of a semiconductor system in accordance with an embodiment.

FIG. 7 is a diagram illustrating a configuration of a semiconductor system 700 in accordance with an embodiment. Referring to FIG. 7, the semiconductor system 700 may include a first semiconductor apparatus 710 and a second semiconductor apparatus 720. The first semiconductor apparatus 710 may provide various control signals required when the second semiconductor apparatus 720 operates. The first semiconductor apparatus 710 may include various types of host devices. For example, the first semiconductor apparatus 710 may be a host device such as a central processing unit (CPU), a graphics processing unit (GPU), a multimedia processor (MMP), a digital signal processor, an application processor (AP), or a memory controller. The second semiconductor apparatus 720 may be a memory apparatus, for example, and the memory apparatus may include volatile memory and/or nonvolatile memory. The volatile memory may include static RAM (SRAM), dynamic RAM (DRAM), or synchronous DRAM (SDRAM), and the nonvolatile memory may include read only memory (ROM), programmable ROM (PROM), electrically erasable and programmable ROM (EEPROM), electrically programmable ROM (EPROM), flash memory, phase change RAM (PRAM), magnetic RAM (MRAM), resistive RAM (RRAM), ferroelectric RAM (FRAM), or the like.

The second semiconductor apparatus 720 may be connected to the first semiconductor apparatus 710 through a first bus 701 and a second bus 702. The first and second buses 701 and 702 may be signal transmission paths, links, or channels for transmitting signals. The first bus 701 may be a unidirectional bus. The first semiconductor apparatus 710 may transmit a first signal TS1 to the second semiconductor apparatus 720 through the first bus 701, and the second semiconductor apparatus 720 may be connected to the first bus 701 and may receive the first signal TS1 transmitted from the first semiconductor apparatus 710. The first signal TS1 may include, for example, control signals such as a command signal, a clock signal, and an address signal. The second bus 702 may be a bidirectional bus. The first semiconductor apparatus 710 may transmit a second signal TS2 to the second semiconductor apparatus 720 through the second bus 702, or receive the second signal TS2 transmitted from the second semiconductor apparatus 720 through the second bus 702. The second semiconductor apparatus 720 may transmit the second signal TS2 to the first semiconductor apparatus 710 through the second bus 702, or may receive the second signal TS2 transmitted from the first semiconductor apparatus 710 through the second bus 702. The second signal TS2 may be data, for example. In an embodiment, the first and second signals TS1 and TS2 may be transmitted through the first and second buses 701 and 702, respectively, as a differential signal pair together with complementary signals TS1B and TS2B. In an embodiment, the first and second signals TS1 and TS2 may be transmitted through the first and second buses 701 and 702, respectively, as single-ended signals.

The first semiconductor apparatus 710 may include a first transmitting circuit 711 (TX), a second transmitting circuit 713 (TX), and a receiving circuit 714 (RX). The first transmitting circuit 711 may be connected to the first bus 701, and may drive the first bus 701 based on an internal signal of the first semiconductor apparatus 710 to transmit the first signal TS1 to the second semiconductor apparatus 720. The second transmitting circuit 713 may be connected to the second bus 702, and may drive the second bus 702 based on the internal signal of the first semiconductor apparatus 710 to transmit the second signal TS2 to the second semiconductor apparatus 720. The receiving circuit 714 may be connected to the second bus 702, and may receive the second signal TS2 transmitted from the second semiconductor apparatus 720 through the second bus 702. The receiving circuit 714 may differentially amplify the second signal TS2 transmitted through the second bus 702 to generate the internal signal used inside the first semiconductor apparatus 710. When the differential signal pair is transmitted through the second bus 702, the receiving circuit 714 may differentially amplify the second signal TS2 and the complementary signal TS2B to generate the internal signal. When the single-ended signal is transmitted through the second bus 702, the receiving circuit 714 may differentially amplify the second signal TS2 and a reference voltage to generate the internal signal. The reference voltage may have a voltage level corresponding to the middle of the range in which the second signal TS2 swings. The receiving circuit 714 may include the receiving circuit 100 illustrated in FIG. 1.

The second semiconductor apparatus 720 may include a first receiving circuit 722 (RX), a transmitting circuit 723 (TX), and a second receiving circuit 724 (RX), The first receiving circuit 722 may be connected to the first bus 701, and may receive the first signal TS1 transmitted from the first semiconductor apparatus 710 through the first bus 701. The first receiving circuit 722 may differentially amplify the first signal TS1 transmitted through the first bus 701 to generate an internal signal used inside the second semiconductor apparatus 720. When the differential signal pair is transmitted through the first bus 701, the first receiving circuit 722 may differentially amplify the first signal TS1 and the complementary signal TS1B to generate the internal signal. When the single-ended signal is transmitted through the first bus 701, the first receiving circuit 722 may differentially amplify the first signal TS1 and the reference voltage to generate the internal signal. The reference voltage may have a voltage level corresponding to the middle of the range in which the first signal TS1 swings. The transmitting circuit 723 may be connected to the second bus 702, and may drive the second bus 702 based on the internal signal of the second semiconductor apparatus 720 to transmit the second signal TS2 to the first semiconductor apparatus 710. The second receiving circuit 724 may be connected to the second bus 702, and may receive the second signal TS2 transmitted from the first semiconductor apparatus 710 through the second bus 702. The second receiving circuit 724 may differentially amplify the second signal TS2 transmitted through the second bus 702 to generate the internal signal used inside the second semiconductor apparatus 720. When the differential signal pair is transmitted through the second bus 702, the second receiving circuit 724 may differentially amplify the second signal TS2 and the complementary signal TS2B to generate the internal signal. When the single-ended signal is transmitted through the second bus 702, the second receiving circuit 724 may differentially amplify the second signal TS2 and the reference voltage to generate the internal signal. The first and second receiving circuits 722 and 724 may each include the receiving circuit 100 illustrated in FIG. 1.

Because the present disclosure may be carried out in other specific forms without departing from its technical spirit or essential features, a person skilled in the art to which the present disclosure pertains should understand that the embodiments described above are illustrative in all aspects and not limitative. The scope of the present disclosure is defined by the claims to be described below rather than the detailed description, and all modifications or modified forms derived from the meaning and scope of the claims and the conceptual equivalents thereto should be interpreted as being included in the scope of the present disclosure.

What is claimed is:

1. A receiving circuit comprising:
   a first amplifying circuit configured to amplify a first input signal and a second input signal to generate a first amplified signal and a second amplified signal;
   a second amplifying circuit configured to amplify the first amplified signal and the second amplified signal to generate a first preliminary output signal and a second preliminary output signal;
   a third amplifying circuit configured to amplify the first preliminary output signal and the second preliminary output signal to generate a first output signal and a second output signal; and
   a feedback circuit configured to change a voltage level of the first amplified signal based on the first output signal, change a voltage level of the second amplified signal based on the second output signal, and adjust variation widths of the voltage levels of the first amplified signal and the second amplified signal based on a current control signal.

2. The receiving circuit according to claim 1, wherein, as the variation widths of the voltage levels increase according to the current control signal, bandwidths of the first amplified signal and the second amplified signal increase.

3. The receiving circuit according to claim 1, wherein the feedback circuit comprises:
   a first transistor configured to connect a first amplifying node, through which the first amplified signal is outputted, and a first node based on the first output signal;
   a second transistor configured to connect a second amplifying node, through which the second amplified signal is outputted, and a second node based on the second output signal; and
   a variable current circuit configured to discharge the first and second nodes based on the current control signal.

4. The receiving circuit according to claim 3, wherein the feedback circuit further comprises:
   a coupling circuit configured to connect the first and second nodes based on a switch control signal,
   wherein, when the first and second nodes are connected through the coupling circuit, DC gains and bandwidths of the first amplified signal and the second amplified signal are increased and AC gains of the first amplified signal and the second amplified signal are decreased.

5. The receiving circuit according to claim 4, wherein the coupling circuit comprises:
   a resistor element connected between the first and second nodes;
   a capacitor element connected in parallel with the resistor element between the first and second nodes; and
   a switch configured to short-circuit the first and second nodes based on the switch control signal.

6. The receiving circuit according to claim 1, wherein the third amplifying circuit comprises:
   a variable load circuit connected between a third node, to which a first voltage is applied, and a first output node, through which the first output signal is outputted, connected between a fourth node, to which the first voltage is applied, and a second output node, through which the second output signal is outputted, and having a resistance value adjusted based on a resistance control signal;
   a first input transistor connected between the first output node and a second voltage terminal and configured to change a voltage level of the first output node based on the second preliminary output signal; and a second input transistor connected between the second output node and the second voltage terminal and configured to change a voltage level of the second output node based on the first preliminary output signal.

7. The receiving circuit according to claim 6, wherein, as a resistance value of the variable load circuit increases based on the resistance control signal, a total gain of the first output signal and the second output signal increases.

8. The receiving circuit according to claim 6, wherein the second amplifying circuit comprises:
a first load transistor configured to provide the first voltage to the first preliminary output node based on a voltage level of the fourth node, wherein the first preliminary output signal is outputted through the first preliminary output node;
a second load transistor configured to provide the first voltage to the second preliminary output node based on a voltage level of the third node, wherein the second preliminary output signal is outputted through the second preliminary output node;
a third input transistor connected between the first preliminary output node and the second voltage terminal and configured to change a voltage level of the first preliminary output node based on the second amplified signal; and
a fourth input transistor connected between the second preliminary output node and the second voltage terminal and configured to change a voltage level of the second preliminary output node based on the first amplified signal.

9. A receiving circuit comprising:
a first amplifying circuit configured to amplify a first input signal and a second input signal to generate a first amplified signal and a second amplified signal;
a second amplifying circuit configured to amplify the first amplified signal and the second amplified signal to generate a first preliminary output signal having a logic level corresponding to the first amplified signal and a second preliminary output signal having a logic level corresponding to the second amplified signal;
a third amplifying circuit configured to amplify the first preliminary output signal and the second preliminary output signal to generate a first output signal having a logic level corresponding to the first preliminary output signal and a second output signal having a logic level corresponding to the second preliminary output signal, and configured to increase a total gain of the first and second output signals based on a resistance control signal; and
a feedback circuit configured to change a voltage level of the first amplified signal based on the first output signal, configured to change a voltage level of the second amplified signal based on the second output signal, and configured to increase bandwidths of the first amplified signal and the second amplified signal based on a current control signal.

10. The receiving circuit according to claim 9, wherein the feedback circuit is further configured to receive a switch control signal, increase DC gains and bandwidths of the first amplified signal and the second amplified signal, and decrease AC gains of the first amplified signal and the second amplified signal based on the switch control signal.

11. The receiving circuit according to claim 9, wherein the feedback circuit comprises:
a first transistor configured to connect a first amplifying node, through which the first amplified signal is outputted, and a first node based on the first output signal;
a second transistor configured to connect a second amplifying node, through which the second amplified signal is outputted, and a second node based on the second output signal; and
a variable current circuit configured to discharge the first and second nodes based on the current control signal.

12. The receiving circuit according to claim 11, wherein the feedback circuit further comprises:
a coupling circuit configured to connect the first and second nodes based on a switch control signal,
wherein, when the first and second nodes are connected through the coupling circuit, DC gains and bandwidths of the first amplified signal and the second amplified signal are increased and AC gains of the first amplified signal and the second amplified signal are decreased.

13. The receiving circuit according to claim 12, wherein the coupling circuit comprises:
a resistor element connected between the first and second nodes;
a capacitor element connected in parallel with the resistor element between the first and second nodes; and
a switch configured to short-circuit the first and second nodes based on the switch control signal.

14. The receiving circuit according to claim 9, wherein the third amplifying circuit comprises:
a variable load circuit connected between a third node, to which a first voltage is applied, and a first output node, through which the first output signal is outputted, connected between a fourth node, to which the first voltage is applied, and a second output node, through which the second output signal is outputted, and having a resistance value adjusted based on a resistance control signal;
a first input transistor connected between the first output node and a second voltage terminal and configured to change a voltage level of the first output node based on the second preliminary output signal; and
a second input transistor connected between the second output node and the second voltage terminal and configured to change a voltage level of the second output node based on the first preliminary output signal.

15. The receiving circuit according to claim 14, wherein, as a resistance value of the variable load circuit increases based on the resistance control signal, a total gain of the first output signal and the second output signal increases.

16. The receiving circuit according to claim 14, wherein the second amplifying circuit comprises:
a first load transistor configured to provide the first voltage to the first preliminary output node based on a voltage level of the fourth node, wherein the first preliminary output signal is outputted through the first preliminary output node;
a second load transistor configured to provide the first voltage to the second preliminary output node based on a voltage level of the third node, wherein the second preliminary output signal is outputted through the second preliminary output node;
a third input transistor connected between the first preliminary output node and the second voltage terminal and configured to change a voltage level of the first preliminary output node based on the second amplified signal; and
a fourth input transistor connected between the second preliminary output node and the second voltage terminal and configured to change a voltage level of the second preliminary output node based on the first amplified signal.

17. A receiving circuit comprising:
a first amplifying circuit configured to amplify a first input signal and a second input signal to generate a first amplified signal and a second amplified signal;
a second amplifying circuit configured to amplify the first amplified signal and the second amplified signal to generate a first preliminary output signal having a logic level corresponding to the first amplified signal and a second preliminary output signal having a logic level corresponding to the second amplified signal;
a third amplifying circuit configured to amplify the first preliminary output signal and the second preliminary output signal to generate a first output signal having a logic level corresponding to the first preliminary output signal and a second output signal having a logic level corresponding to the second preliminary output signal; and
a feedback circuit configured to change a voltage level of the first amplified signal based on the first output signal, configured to change a voltage level of the second amplified signal based on the second output signal, and configured to change bandwidths of the first amplified signal and the second amplified signal based on a current control signal.

18. The receiving circuit according to claim 17, wherein the third amplifying circuit is configured to receive a resistance control signal and configured to change a total gain of the first and second output signals based on the resistance control signal.

* * * * *